United States Patent
Levinski

(10) Patent No.: US 12,411,420 B2
(45) Date of Patent: Sep. 9, 2025

(54) SMALL IN-DIE TARGET DESIGN FOR OVERLAY MEASUREMENT

(71) Applicant: KLA Corporation, Milpitas, CA (US)

(72) Inventor: Vladimir Levinski, Migdal HaEmek (IL)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 18/673,905

(22) Filed: May 24, 2024

(65) Prior Publication Data

US 2025/0110412 A1    Apr. 3, 2025

Related U.S. Application Data

(60) Provisional application No. 63/541,302, filed on Sep. 29, 2023.

(51) Int. Cl.
   *G03F 7/00* (2006.01)

(52) U.S. Cl.
   CPC ...... *G03F 7/70633* (2013.01); *G03F 7/70683* (2013.01); *G03F 7/706849* (2023.05); *G03F 7/706851* (2023.05)

(58) Field of Classification Search
   CPC ............ G03F 7/70605; G03F 7/70625; G03F 7/70633; G03F 7/70653; G03F 7/70681; G03F 7/70683; G03F 7/706843; G03F 7/706849; G03F 7/706851
   See application file for complete search history.

(56) References Cited

U.S. PATENT DOCUMENTS

| | | | | |
|---|---|---|---|---|
| 6,804,005 B2 * | 10/2004 | Bischoff | ............. | G03F 7/70633 356/369 |
| 7,236,244 B1 * | 6/2007 | Yang | .................... | G03F 9/7065 356/369 |
| 7,687,925 B2 * | 3/2010 | Marokkey | ........... | G03F 7/70633 257/E23.179 |
| 8,203,223 B2 * | 6/2012 | Marokkey | ........... | G03F 7/70633 430/22 |
| 9,927,720 B2 * | 3/2018 | Kim | .................... | G03F 7/70641 |

(Continued)

OTHER PUBLICATIONS

Korean Intellectual Property Office, International Search Report and Written Opinion received in International Application No. PCT/US2024/046290, Dec. 23, 2024, 10 pages.

(Continued)

*Primary Examiner* — Gordon J Stock, Jr.
(74) *Attorney, Agent, or Firm* — Suiter Swantz IP

(57) ABSTRACT

An overlay metrology system may generate overlay measurements based on isolated images of features on different layers of an overlay target. For example, a target may include a first-layer structure including periodic features with a fine pitch selected to be unresolved by the overlay metrology system, where the gratings structures are oriented to rotate a polarization of rotated diffraction orders relative to a polarization of incident illumination, where the rotated diffraction orders include at least first-order diffraction. In this way, first images generated with a collection polarizer oriented to capture the rotated diffraction orders may include only the first-layer structure, whereas second images generated with a collection polarizer oriented to be aligned with a polarization of incident illumination may include only the second-layer features.

31 Claims, 10 Drawing Sheets

(56) References Cited

U.S. PATENT DOCUMENTS

| | | | |
|---|---|---|---|
| 10,048,132 B2* | 8/2018 | Hill | G03F 7/70633 |
| 10,337,991 B2 | 7/2019 | Levinski | |
| 10,371,626 B2* | 8/2019 | Hill | G01N 21/255 |
| 10,520,832 B2* | 12/2019 | Levinski | G01N 21/8851 |
| 10,579,768 B2* | 3/2020 | Levinski | G03F 7/70683 |
| 10,788,766 B2* | 9/2020 | Goorden | G03F 9/7084 |
| 10,969,697 B1* | 4/2021 | Hsieh | G03F 7/70683 |
| 11,112,704 B2* | 9/2021 | Adam | G06T 7/80 |
| 11,353,321 B2* | 6/2022 | Volkovich | G03F 7/70483 |
| 11,428,642 B2* | 8/2022 | Hill | G01N 21/8851 |
| 11,531,275 B1* | 12/2022 | Hill | G03F 7/70491 |
| 11,800,212 B1* | 10/2023 | Vaknin | G03F 7/70653 |
| 12,001,148 B2* | 6/2024 | Manassen | H04N 23/56 |
| 12,253,805 B2* | 3/2025 | Levinski | G03F 7/70683 |
| 2016/0178351 A1 | 6/2016 | Amit et al. | |
| 2018/0373166 A1 | 12/2018 | Sanguinetti et al. | |
| 2019/0137893 A1 | 5/2019 | Den Boef et al. | |
| 2021/0255551 A1 | 8/2021 | Levinski et al. | |
| 2024/0053687 A1 | 2/2024 | Levinski et al. | |
| 2025/0085642 A1* | 3/2025 | Choi | G03F 7/706849 |

OTHER PUBLICATIONS

Attota et al., "Evaluation of new in-chip and arrayed line overlay target design," Proceedings of SPIE, vol. 5375, Metrology, Inspection, And Process Control for Microlithography XVIII, May 24, 2004, 8 pages.

Ku et al., "In-chip overlay measurement by existing bright-field imaging optical tools," Proceedings of SPIE, vol. 5752, Metrology, Inspection, and Process Control for Microlithography XIX, May 10, 2005, 12 pages.

* cited by examiner

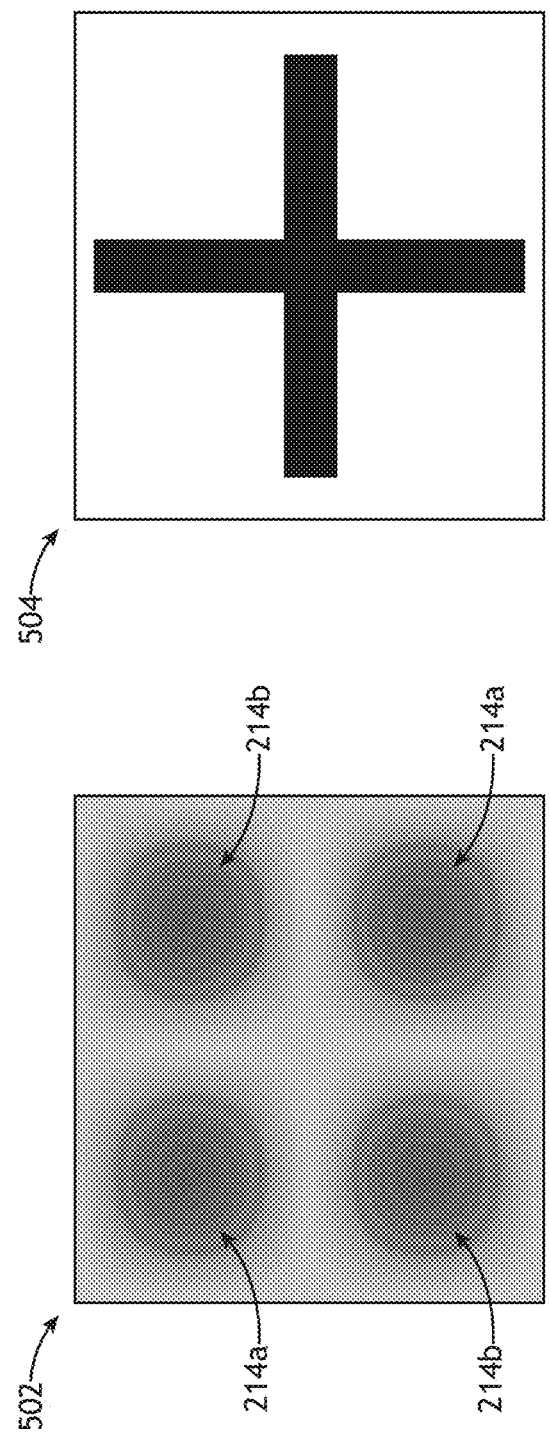

SMALL IN-DIE TARGET DESIGN FOR OVERLAY MEASUREMENT

CROSS-REFERENCE TO RELATED APPLICATION

The present application claims the benefit under 35 U.S.C. § 119 (e) of U.S. Provisional Application Ser. No. 63/541,302, filed Sep. 29, 2023, entitled SMALL IN-DIE TARGET DESIGN FOR OVL MEASUREMENT, naming Vladimir Levinski as inventor, which is incorporated herein by reference in the entirety.

TECHNICAL FIELD

The present disclosure relates generally to overlay metrology and, more particularly, to an overlay metrology target design utilizing polarization-based isolation of target features when imaged.

BACKGROUND

Many approaches to overlay metrology utilize dedicated overlay targets having features designed for a particular measurement approach. However, a central challenge to the use of dedicated overlay targets relates to variations in printing between device features of interest and the dedicated overlay targets used to measure overlay. This can result in the overlay targets not being fully representative of the device features of interest, which can induce systematic overlay measurement errors.

Efforts to mitigate such errors typically incorporate segmentation of optically-resolvable features with smaller features having a pitch similar to device features of interest. Further efforts to mitigate such errors incorporate overlay targets within semiconductor dies in locations that are relatively close to the device features of interest. Such overlay targets may be referred to as in-die overlay targets or on-chip overlay targets. However, existing in-die overlay target designs still suffer from undesirable overlay measurement errors, which may be associated with coupling between overlay shifts in orthogonal directions (e.g., cross-talk between measurement signals associated with target features on different sample layers) and/or effects of stack variations.

There is therefore a need to develop systems and methods to cure the above deficiencies.

SUMMARY

In embodiments, the techniques described herein relate to an overlay metrology system including a controller including one or more processors configured to execute program instructions causing the one or more processors to receive one or more first images of an overlay target on a sample based on illumination with an illumination beam in accordance with a metrology recipe, where the overlay target includes a first-layer structure on a first layer of the sample, where the first-layer structure includes a first set of periodic features and a second set of periodic features oriented at a 90-degree angle with respect to the first set of periodic features, where the illumination beam is polarized at a 45-degree angle with respect to the first set of periodic features and the second set of periodic features when implementing the metrology recipe, where the first set of periodic features and the second set of periodic features are arranged in accordance with the metrology recipe to rotate a polarization of one or more rotated diffraction orders from the first-layer structure relative to a polarization of zero-order diffraction, where the one or more rotated diffraction orders include at least first-order diffraction from the first-layer structure; and a second-layer structure on a second layer of the sample, where the second-layer structure includes one or more features providing an unmodified polarization direction for light emanating from the second-layer structure in response to the illumination beam; where the one or more first images are generated with first polarization-filtered light aligned with the polarization of the one or more rotated diffraction orders; receive one or more second images of the overlay target based on the illumination with the illumination beam in accordance with the metrology recipe, where the one or more second images are generated with second polarization-filtered light aligned orthogonal to the polarization of the one or more rotated diffraction orders; and determine one or more overlay measurements of the sample based on the one or more first images and the one or more second images.

In embodiments, the techniques described herein relate to an overlay metrology system, where the one or more first images include the first-layer structure and exclude the second-layer structure.

In embodiments, the techniques described herein relate to an overlay metrology system, where the one or more second images include the second-layer structure and exclude the first-layer structure.

In embodiments, the techniques described herein relate to an overlay metrology system, where a size of the overlay target is three micrometers or smaller in any dimension.

In embodiments, the techniques described herein relate to an overlay metrology system, where the first layer of the sample is a process layer, where the second layer of the sample is a resist layer.

In embodiments, the techniques described herein relate to an overlay metrology system, where the first layer of the sample is a resist layer, where the second layer of the sample is a process layer.

In embodiments, the techniques described herein relate to an overlay metrology system, where the first set of periodic features and the second set of periodic features include features with a pitch smaller than a wavelength of the illumination beam.

In embodiments, the techniques described herein relate to an overlay metrology system, where the first-layer structure includes an interleaved pattern of alternating zones of the first set of periodic features and the second set of periodic features, where a pitch of the first set of periodic features and the second set of periodic features is a fine pitch, where the first-layer structure has a first coarse pitch associated with a spatial extent of a first of the zones including at least some of the first set of periodic features and an adjacent one of the zones including at least some of the second set of periodic features.

In embodiments, the techniques described herein relate to an overlay metrology system, where the second-layer structure is non-periodic.

In embodiments, the techniques described herein relate to an overlay metrology system, where the second-layer structure is a cross structure.

In embodiments, the techniques described herein relate to an overlay metrology system, where the illumination beam has a circular profile.

In embodiments, the techniques described herein relate to an overlay metrology system, where the illumination beam has a wedge-shaped profile.

In embodiments, the techniques described herein relate to an overlay metrology system, where an edge of the wedge-shaped profile is oriented parallel to a polarization direction of the illumination beam.

In embodiments, the techniques described herein relate to an overlay metrology system, where an edge of the wedge-shaped profile is oriented orthogonal to a polarization direction of the illumination beam.

In embodiments, the techniques described herein relate to an overlay metrology system including an illumination source configured to generate an illumination beam; an illumination sub-system including one or more lenses to direct the illumination beam to an overlay target on a sample when implementing a metrology recipe, where the overlay target in accordance with the metrology recipe includes a first-layer structure on a first layer of the sample, where the first-layer structure includes a first set of periodic features and a second set of periodic features oriented at a 90-degree angle with respect to the first set of periodic features, where the first set of periodic features and the second set of periodic features are arranged in accordance with the metrology recipe to rotate a polarization of one or more rotated diffraction orders from the first-layer structure relative to a polarization of zero-order diffraction, where the one or more rotated diffraction orders include at least first-order diffraction from the first-layer structure; and a second-layer structure on a second layer of the sample, where the second-layer structure includes one or more features providing an unmodified polarization direction for light emanating from the second-layer structure in response to the illumination beam; an imaging sub-system including one or more channels, each including one or more polarizers and one or more detectors, where the one or more channels are configured to generate one or more first images with first polarization-filtered light aligned with the polarization of the one or more rotated diffraction orders, where the one or more channels are configured to generate one or more second images with second polarization-filtered light aligned orthogonal to the polarization of the one or more rotated diffraction orders; and a controller communicatively coupled to the one or more detectors, the controller including one or more processors configured to execute program instructions causing the one or more processors to determine overlay measurements of the sample based on the one or more first images and the one or more second images.

In embodiments, the techniques described herein relate to an overlay metrology system, where the one or more first images include the first-layer structure and exclude the second-layer structure.

In embodiments, the techniques described herein relate to an overlay metrology system, where the one or more second images include the second-layer structure and exclude the first-layer structure.

In embodiments, the techniques described herein relate to an overlay metrology system, where a size of the overlay target is three micrometers or smaller in any dimension.

In embodiments, the techniques described herein relate to an overlay metrology system, where the first set of periodic features and the second set of periodic features include features with a pitch smaller than a wavelength of the illumination beam.

In embodiments, the techniques described herein relate to an overlay metrology system, where the one or more channels include a first channel to generate the one or more first images, where the first channel includes a first of the one or more detectors and a first polarizer aligned with the polarization of the one or more rotated diffraction orders; and a second channel to generate the one or more second images, where the second channel includes a second of the one or more detectors and a second polarizer orthogonal to the polarization of the one or more rotated diffraction orders.

In embodiments, the techniques described herein relate to an overlay metrology system, where the one or more channels includes a single channel with a single polarizer, where the one or more first images are generated with the single polarizer aligned with the polarization of the one or more rotated diffraction orders, where the one or more second images are generated with the single polarizer orthogonal to the polarization of the one or more rotated diffraction orders.

In embodiments, the techniques described herein relate to an overlay metrology system, where the first layer of the sample is a process layer, where the second layer of the sample is a resist layer.

In embodiments, the techniques described herein relate to an overlay metrology system, where the first layer of the sample is a resist layer, where the second layer of the sample is a process layer.

In embodiments, the techniques described herein relate to an overlay metrology system, where the first-layer structure includes an interleaved pattern of alternating zones of the first set of periodic features and the second set of periodic features, where a pitch of the first set of periodic features and the second set of periodic features is a fine pitch, where the first-layer structure has a first coarse pitch associated with a spatial extent of a first of the zones including at least some of the first set of periodic features and an adjacent one of the zones including at least some of the second set of periodic features.

In embodiments, the techniques described herein relate to an overlay metrology system, where the second-layer structure is non-periodic.

In embodiments, the techniques described herein relate to an overlay metrology system, where the second-layer structure is a cross structure.

In embodiments, the techniques described herein relate to an overlay metrology system, where the illumination beam has a circular profile.

In embodiments, the techniques described herein relate to an overlay metrology system, where the illumination beam has a wedge-shaped profile.

In embodiments, the techniques described herein relate to an overlay metrology system, where an edge of the wedge-shaped profile is oriented parallel to a polarization direction of the illumination beam.

In embodiments, the techniques described herein relate to an overlay metrology system, where an edge of the wedge-shaped profile is oriented orthogonal to a polarization direction of the illumination beam.

In embodiments, the techniques described herein relate to an overlay metrology method including generating one or more first images of an overlay target on a sample based on illumination with an illumination beam in accordance with a metrology recipe, where the overlay target includes a first-layer structure on a first layer of the sample, where the first-layer structure includes a first set of periodic features and a second set of periodic features oriented at a 90-degree angle with respect to the first set of periodic features, where the illumination beam is polarized at a 45-degree angle with respect to the first set of periodic features and the second set of periodic features when implementing the metrology recipe, where the first set of periodic features and the second set of periodic features are arranged in accordance with the metrology recipe to rotate a polarization of one or more rotated diffraction orders from the first-layer structure relative to a polarization of zero-order diffraction, where the one or more rotated diffraction orders include at least first-order diffraction from the first-layer structure; and a second-layer structure on a second layer of the sample, where the second-layer structure includes one or more features providing an unmodified polarization direction for light emanating from the second-layer structure in response to the illumination beam; where the one or more first images are generated with first polarization-filtered light aligned with the polarization of the one or more rotated diffraction orders, where the one or more first images include the first-layer structure and exclude the second-layer structure; generating one or more second images of the overlay target based on illumination with the illumination beam in accordance with the metrology recipe, where the one or more second images are generated with second polarization-filtered light aligned orthogonal to the polarization of the one or more rotated diffraction orders, where the one or more second images include the second-layer structure and exclude the first-layer structure; and determining overlay measurements of the sample based on the one or more first images and the one or more second images.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

FIG. 5A illustrates an image of the first-layer structure in FIG. 2A generated using an illumination polarizer and a collection polarizer oriented in orthogonal directions, in accordance with one or more embodiments of the present disclosure.

FIG. 5B illustrates an image of the second-layer structure of FIG. 2C generated with an illumination polarizer and a collection polarizer with parallel orientations, in accordance with one or more embodiments of the present disclosure.

DETAILED DESCRIPTION

Figure 1A:
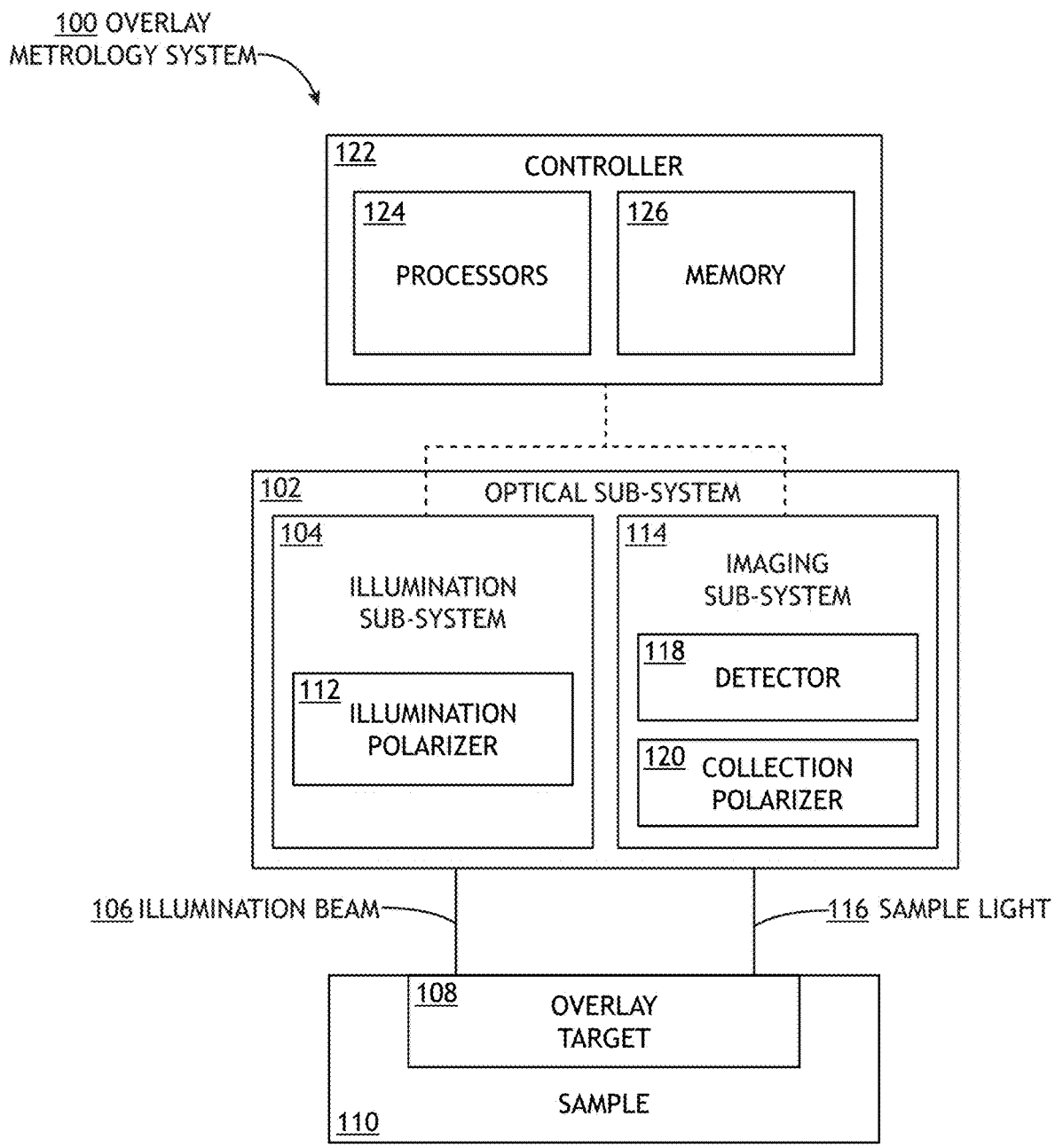
FIG. 1A illustrates a conceptual view illustrating an overlay metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for imaging overlay metrology using overlay targets designed to provide independent imaging of features on different sample layers and further designed to prevent cross-talk between features on different sample layers. It is contemplated herein that cross-talk between features on different sample layers may be increasingly problematic as the overall size of an overlay target is reduced. For example, typical overlay target designs may suffer from unacceptable cross-talk when printed with sizes suitable for in-die placement (e.g., having an overall size of three (3) micrometers per side or less). However, the systems and methods disclosed herein may enable small overlay targets suitable for in-die placement (e.g., having an overall size of 3 micrometers per side or less) while eliminating cross-talk or at least reducing cross-talk to an acceptable tolerance level. Further, the pitches of periodic features on the target may generally be as small as possible or practicable.

In embodiments, an overlay target may include a first-layer structure on a first layer of the sample, where the first-layer structure includes periodic features designed to selectively rotate a polarization at least some diffraction orders (e.g., at least first-order diffraction) by 90 degrees while maintaining a polarization direction of at least zero-order diffraction. For example, the first-layer structure may rotate at least first-order diffraction (e.g., may rotate first-order diffraction and potentially additional higher-order diffraction) by 90 degrees relative to zero-order diffraction. For convenience, diffraction orders with rotated polarization directions relative to a polarization of incident illumination are referred to as rotated diffraction orders. The overlay target may further include a second-layer structure on a second layer of the sample, where the second-layer structure does not exhibit the polarization-rotating behavior of the first-layer structure.

It is contemplated herein that such a configuration may enable isolated imaging of the first-layer structure and the second-layer structure using polarization-based techniques. For example, an overlay metrology system may illuminate the overlay target with light having a polarization oriented at a 45-degree angle relative to the periodic features of the first-layer structure and one or more polarizers in an imaging sub-system. In particular, adjusting a polarizer in an imaging sub-system at a 135-degree angle relative to the features of the first-layer structure may isolate polarization-rotated first-order diffraction from the first-layer structure such that a resulting image may be associated only with the first-layer structure. Further, adjusting a polarizer in the imaging sub-system to be parallel to the incident illumination may block the polarization-rotated first order light from the first-layer structure but pass light associated with the second-layer structure such that the associated image may be associated only with the second-layer structure. An overlay measurement may then be generated based on centers of symmetry of the overlay target in the two images. Notably, these two isolated images may be generated either sequentially through sequential adjustment of the polarizer in the imaging sub-system or simultaneously using a multi-channel configuration.

Various designs and considerations for overlay targets are generally described in R. Attota, et al., "Evaluation of new in-chip and arrayed line overlay target designs," Proc. SPIE 5375, Metrology, Inspection, and Process Control for Microlithography XVIII, (24 May 2004); Y. S. Ku, "In-chip overlay measurement by existing bright-field imaging optical tools," Proc. SPIE 5752, Metrology, Inspection, and Process Control for Microlithography XIX, (10 May 2005); U.S. Patent Publication No. 2024/0053687 published on Feb. 15, 2024; and U.S. Pat. No. 10,337,991 issued on Jul. 2, 2019; all of which are incorporated herein by reference in their entireties.

Referring now to FIGS. 1A-7, systems and methods providing isolated imaging of features of an overlay target in different sample layers are described in greater detail, in accordance with one or more embodiments of the present disclosure.

FIG. 1A illustrates a conceptual view illustrating an overlay metrology system 100, in accordance with one or more embodiments of the present disclosure.

In some embodiments, the overlay metrology system 100 includes an optical sub-system 102 to acquire overlay signals from overlay targets based on any number of metrology recipes.

The optical sub-system 102 may include an illumination sub-system 104 to direct at least one illumination beam 106 with a selected polarization to an overlay target 108 on a sample 110. For example, the illumination sub-system 104 may include an illumination polarizer 112 to ensure that the illumination beam 106 incident on the sample 110 is linearly polarized along a selected direction.

The optical sub-system 102 may further include an imaging sub-system 114 to collect light or other electromagnetic radiation (referred to herein as sample light 116) emanating from the overlay target 108, where at least a portion of the sample light 116 is used to generate one or more images of the overlay target 108 on one or more detectors 118. Further, the imaging sub-system 114 may include a collection polarizer 120 to control a polarization of light on a detector 118.

For example, as will be described in greater detail herein, isolated images of features of the overlay target 108 on different layers of the sample 110 may be generated with different orientations of the collection polarizer 120. Further, in some embodiments, the imaging sub-system 114 includes multiple channels with separate collection polarizers 120 to simultaneously capture isolated images of features of the overlay target 108 on different layers of the sample 110 based on different orientations of the respective collection polarizers 120.

The optical sub-system 102 may be configurable to generate images based on any number of metrology recipes defining measurement parameters for image acquisition and/or design parameters of an overlay target 108 to be imaged. For example, a metrology recipe may include various aspects of an overlay target 108 or a design of an overlay target 108 including, but not limited to, a layout of target features on one or more sample layers, feature sizes, or feature pitches. As another example, a metrology recipe may include illumination parameters such as, but not limited to, an illumination wavelength, an illumination pupil distribution (e.g., a distribution of illumination angles and associated intensities of illumination at those angles), a polarization of incident illumination, a spatial distribution of illumination, or a sample height. By way of another example, a metrology recipe may include collection parameters such as, but not limited to, a collection pupil distribution (e.g., a desired distribution of angular light from the sample 110 to be used for a measurement and associated filtered intensities at those angles), collection field stop settings to select portions of the sample of interest, polarization of collected light, or wavelength filters.

In some embodiments, the overlay metrology system 100 includes a controller 122 communicatively coupled to the optical sub-system 102. The controller 122 may be configured to direct the optical sub-system 102 to generate overlay signals based on one or more selected metrology recipes. The controller 122 may be further configured to receive data including, but not limited to, images of the overlay target 108 (or structures on different layers thereof) from a detector 118. Additionally, the controller 122 may be configured to determine overlay associated with an overlay target 108 based on the acquired overlay signals.

In some embodiments, the controller 122 includes one or more processors 124. For example, the one or more processors 124 may be configured to execute a set of program instructions maintained in a memory 126, or memory device. The one or more processors 124 of a controller 122 may include any processing element known in the art. In this sense, the one or more processors 124 may include any microprocessor-type device configured to execute algorithms and/or instructions. Further, the memory 126 may include any storage medium known in the art suitable for storing program instructions executable by the associated one or more processors 124. For example, the memory 126 may include a non-transitory memory medium. As an additional example, the memory 126 may include, but is not limited to, a read-only memory, a random-access memory, a magnetic or optical memory device (e.g., disk), a magnetic tape, a solid-state drive and the like. It is further noted that memory 126 may be housed in a common controller housing with the one or more processors 124.

Referring now to FIGS. 2A-6B, an overlay target 108 is described, in accordance with one or more embodiments of the present disclosure.

Figure 2A:
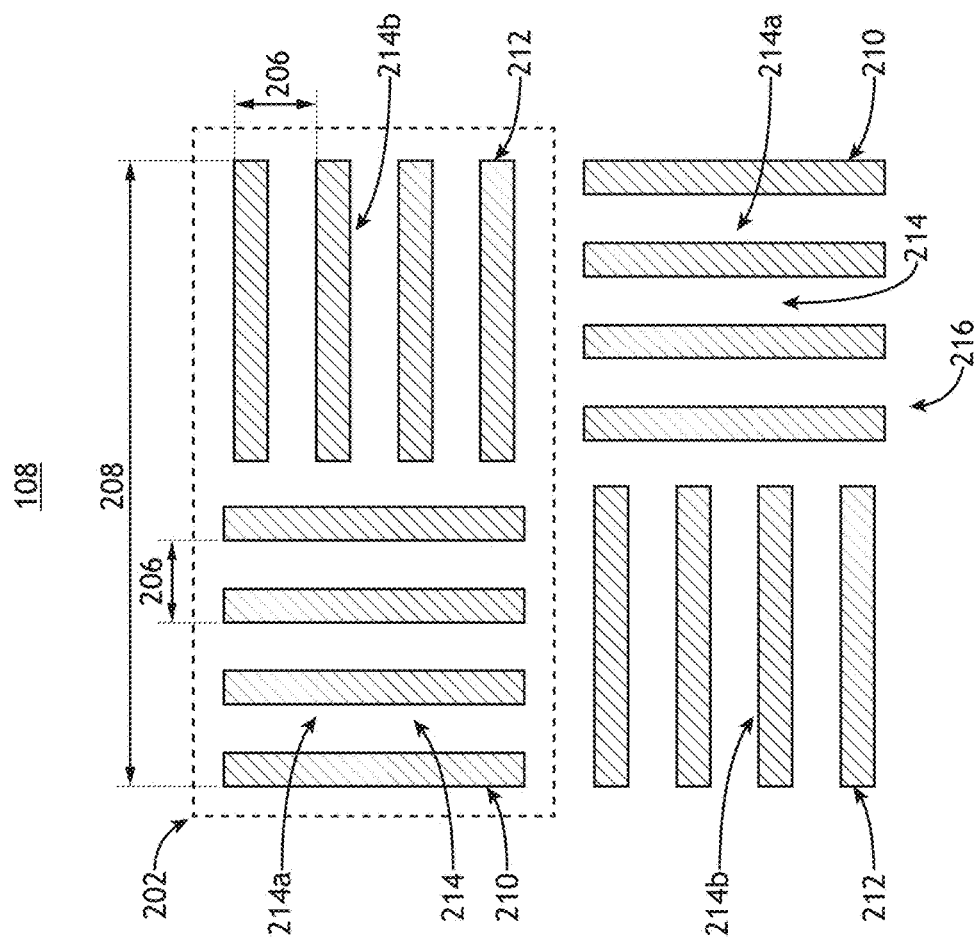
FIG. 2A illustrates a top view of a first design of a first-layer structure of an overlay target located on a first layer of the sample, in accordance with one or more embodiments of the present disclosure.
Figure 2B:
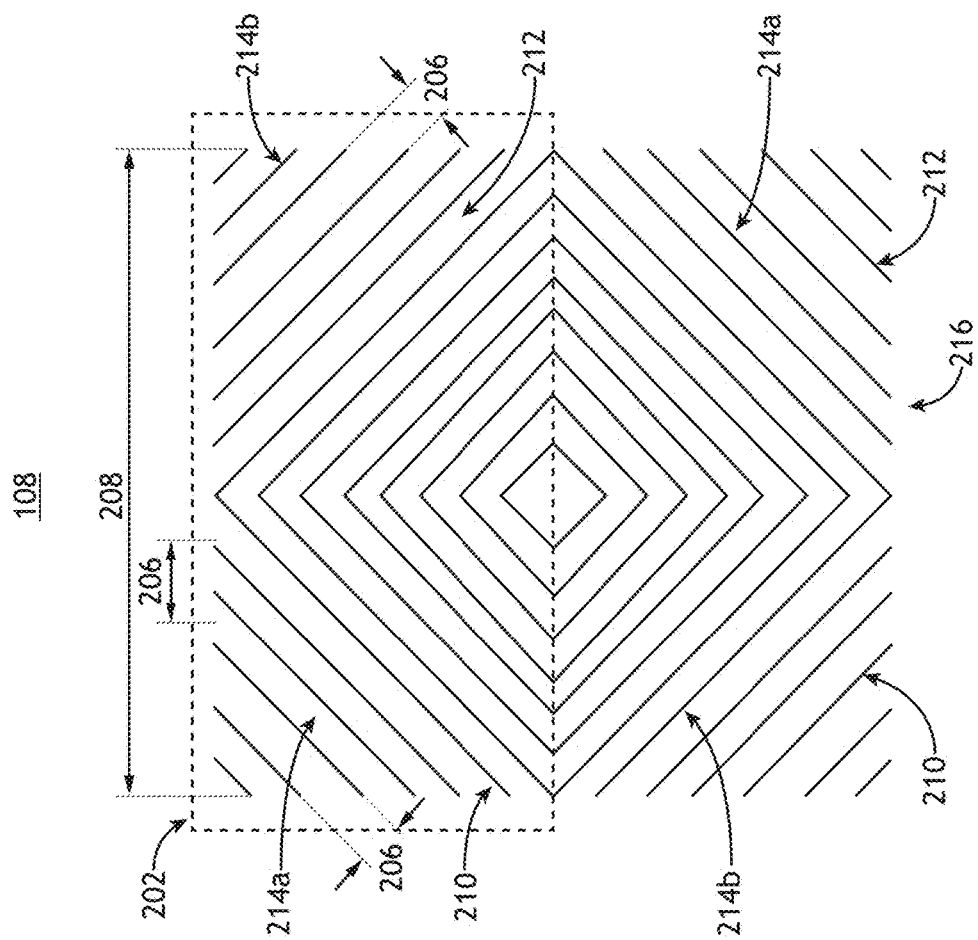
FIG. 2B illustrates a top view of a second design of first-layer structure of an overlay target located on a first layer of the sample, in accordance with one or more embodiments of the present disclosure.
Figure 2C:
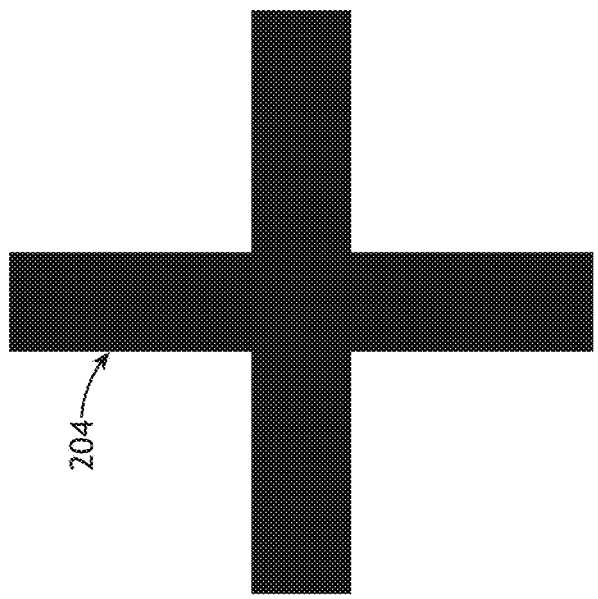
FIG. 2C illustrates a top view of a second-layer structure of an overlay target located on a second layer of the sample, in accordance with one or more embodiments of the present disclosure.

FIG. 2A illustrates a top view of a first design of a first-layer structure 202 of an overlay target 108 located on a first layer of the sample 110, in accordance with one or more embodiments of the present disclosure. FIG. 2B illustrates a top view of a second design of first-layer structure 202 of an overlay target 108 located on a first layer of the sample 110, in accordance with one or more embodiments of the present disclosure. FIG. 2C illustrates a top view of a second-layer structure 204 of an overlay target 108 located on a second layer of the sample 110, in accordance with one or more embodiments of the present disclosure.

In embodiments, the first-layer structure 202 includes periodic features characterized by a fine pitch 206 (e.g., fine period, a segmentation pitch, a segmentation period, or the like) and coarse pitch 208 (e.g., a coarse period). For example, the first-layer structure 202 may include a first set of periodic features 210 and a second set of periodic features 212, where a direction of periodicity of the first set of periodic features 210 is orthogonal to (e.g., at a 90-degree angle to) a direction of periodicity of the second set of periodic features 212. Further, features within a coarse pitch 208 may be further arranged into two zones 214 (e.g., two adjacent zones 214 may form the coarse pitch 208), each having different polarization directions. Put another way, the coarse pitch 208 may correspond to a spatial extent of two adjacent zones 214.

For example, box 216 in FIGS. 2A and 2B depicts features within a period associated with the coarse pitch 208, which are divided into a first zone 214a with some of the first set of periodic features 210 and a second zone 214b with some of the second set of periodic features 212. Further, the first-layer structure 202 may include an interleaved pattern of alternating zones 214. For example, FIGS. 2A and 2B depict configurations in which zones 214a,b including features with orthogonal periodicity are distributed along different diagonals of the overlay target 108. In this configuration, a coarse pitch 208 along both the X and Y directions includes two zones 214a,b having orthogonal periodicity with the fine pitch 206.

In embodiments, the fine pitch 206 is selected to be smaller than a wavelength of the illumination beam 106 of the optical sub-system 102 and in some cases substantially smaller than the wavelength of the illumination beam 106. Put another way, the fine pitch 206 may be selected to be unresolvable by the imaging sub-system 114 of the overlay metrology system 100. However, this is not a requirement. In some embodiments, the fine pitch 206 is resolvable by the imaging sub-system 114.

In embodiments, any of the zones 214a,b may be large enough to be resolvable by the imaging sub-system 114. In this way, although the periodic features within the zones having the fine pitch 206 may not be resolvable, the zones 214a,b themselves may be resolvable and thus provide a measurable signal in an image of the overlay target 108. However, in some embodiments, the first-layer structure 202 (and the overlay target 108 as a whole) is printed with dimensions suitable for placement within die regions of the sample 110 (e.g., close to device features). For example, the first-layer structure 202 (and the overlay target 108 as a whole) may have a size along any or all dimensions of 3 micrometers or less.

It is contemplated herein that, when the illumination beam 106 has a particular polarization, the first-layer structure 202 may generate diffraction orders associated with the fine pitch 206, where a polarization direction of at least some non-zero diffraction orders are rotated with respect to zero-order diffraction. For example, the first set of periodic features 210 and the second set of periodic features 212 may rotate a polarization direction of at least first-order diffraction from the first-layer structure 202 relative to zero-order diffraction from the first-layer structure 202. As described previously herein, the diffraction orders with rotated polarization (e.g., at least the first-order diffraction from the first-layer structure 202) are referred to as rotated diffraction orders.

For example, the first-layer structure 202 in FIG. 2A may rotate a polarization of all diffraction except zero-order diffraction by 90 degrees when the polarization of the illumination beam 106 is oriented at 45 degrees or 135 degrees (e.g., at a 45-degree angle with respect to the directions of periodicity of the first set of periodic features 210 and the second set of periodic features 212 in this design). As another example, the first-layer structure 202 in FIG. 2B may rotate a polarization of odd diffraction orders (e.g., first-order diffraction, third-order diffraction, and the like) by 90 degrees when the polarization of the illumination beam 106 is oriented at 0 degrees or 90 degrees (e.g., first-order diffraction, third-order diffraction, and the like), but zero-order diffraction as well as even-order diffraction (e.g., second-order diffraction, fourth-order diffraction, or the like) may have the same polarization direction as the incident illumination beam 106.

Figure 3B:
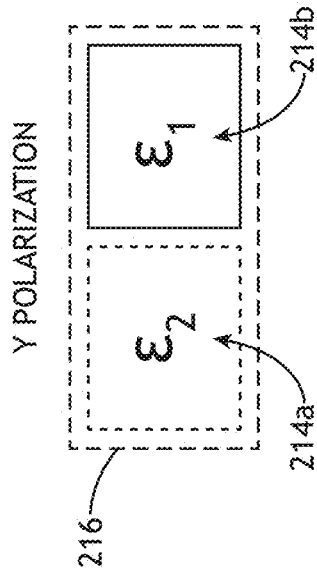
FIG. 3B illustrates an effective medium representation of structures within a coarse pitch of the overlay target in FIG. 2A for light polarized along the Y direction, in accordance with one or more embodiments of the present disclosure.
Figure 3A:
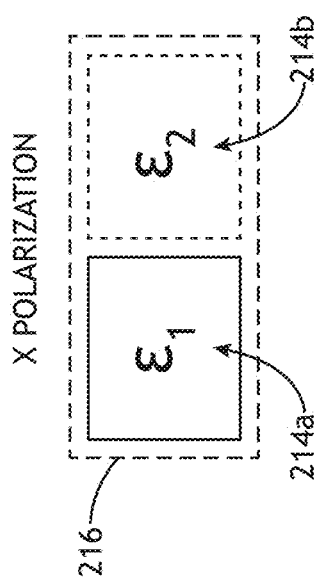
FIG. 3A illustrates an effective medium representation of structures within a coarse pitch of the overlay target in FIG. 2A for light polarized along the X direction, in accordance with one or more embodiments of the present disclosure.
Figure 4:
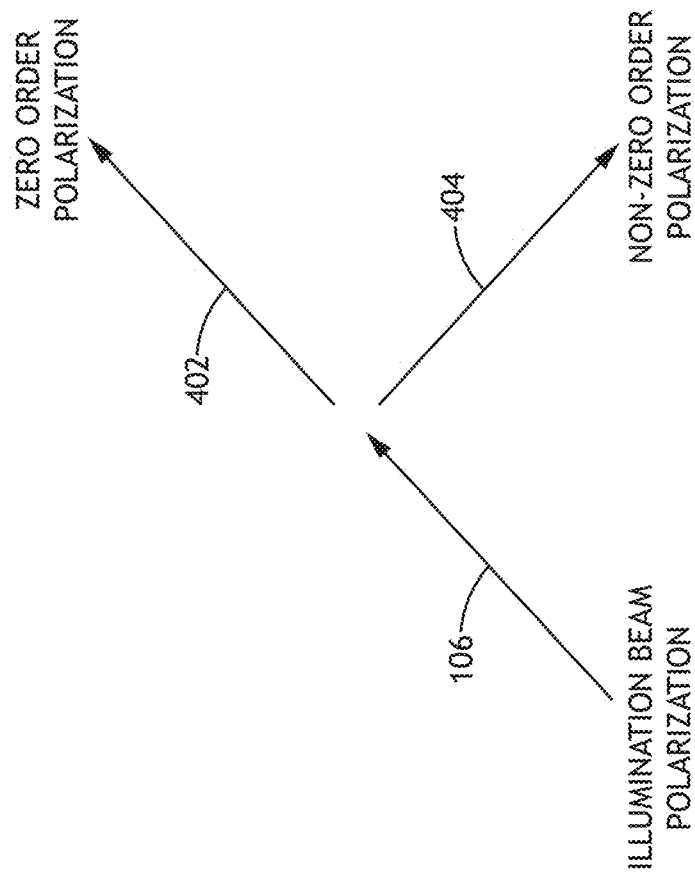
FIG. 4 illustrates a conceptual illustration of an electric field direction of various diffraction orders generated by the first-layer structure illustrated in FIG. 2A upon illumination with an illumination beam having a polarization oriented 45 degrees, in accordance with one or more embodiments of the present disclosure.

The polarization-rotating properties of the first-layer structure 202 may be understood by considering the effective permittivities of the different zones of periodic features. FIGS. 3A-4 depict the polarization behavior and polarization-dependent imaging of an overlay target 108 with first-layer structure 202 arranged according to FIG. 2A.

FIG. 3A illustrates an effective medium representation of structures within a coarse pitch 208 of the overlay target 108 in FIG. 2A (e.g., features within the box 216) for light polarized along the X direction, in accordance with one or more embodiments of the present disclosure. FIG. 3B illustrates an effective medium representation of structures within a coarse pitch 208 of the overlay target 108 in FIG. 2A (e.g., features within the box 216) for light polarized along the Y direction, in accordance with one or more embodiments of the present disclosure.

It is contemplated herein that the first-layer structure 202 operates as a half-wave plate for all diffraction orders apart from zero order diffraction.

In FIGS. 3A and 3B, the effective medium for permittivity are defined by the following formulae:

$$\varepsilon_1 = \epsilon_{Gr} \cdot \eta + \epsilon_{sur} \cdot (1 - \eta) \quad (1)$$

$$\varepsilon_2 = \frac{\epsilon_{Gr} \cdot \epsilon_{sur}}{\epsilon_{Gr} \cdot (1 - \eta) + \epsilon_{sur} \cdot \eta}. \quad (2)$$

where $\epsilon_{Gr}$ is a permittivity of a material forming the grating features (e.g., the first set of periodic features 210 and the second set of periodic features 212), $\epsilon_{sur}$ is a permittivity of material surrounding the grating features, and $\eta$ is a fraction of the coarse pitch 208 associated with the segmentation with the fine pitch 206 along the X direction (e.g., a width of the first zone 214a in FIG. 2A relative to the coarse pitch 208). Put another way, n corresponds to a duty cycle of the orthogonal fine segmentation.

As illustrated by equations (1) and (2) along with FIGS. 3A-3B, arranging features on a layer of an overlay target 108 to provide both a coarse pitch 208 and zones of orthogonal fine pitch 206 effectively operates as a wave plate and provides different phase shifts for light polarized along the orthogonal directions.

FIG. 4 illustrates a conceptual illustration of an electric field direction (e.g., polarization direction) of various diffraction orders generated by the first-layer structure 202 illustrated in FIG. 2A upon illumination with an illumination beam 106 having a polarization oriented 45 degrees (e.g., with respect to the first set of periodic features 210 and the second set of periodic features 212), in accordance with one or more embodiments of the present disclosure. As illustrated in FIG. 4, zero-order diffraction 402 may have the same electric field direction as the incident illumination beam 106, whereas non-zero diffraction orders 404 may be orthogonally polarized to the zero-order diffraction 402.

As a result, a collection polarizer 120 in the imaging sub-system 114 oriented at 135 degrees may block the zero-order diffraction 402 and isolate the rotated non-zero diffraction orders 404 without reducing their amplitudes.

FIG. 5A illustrates an image 502 of the first-layer structure 202 in FIG. 2A generated using an illumination polarizer 112 and a collection polarizer 120 oriented in orthogonal directions, in accordance with one or more embodiments of the present disclosure. For example, the image 502 may be generated using an illumination polarizer 112 oriented at 45 degrees and a collection polarizer 120 oriented at 135 degrees. Using this cross-polarization scheme, a detector 118 may register a whole signal associated with the polarization-rotated diffraction orders without zero-order diffraction 402 (which may be referred to as DC components or constant components).

Further, the contrast of the image 502 may depend on the materials used to fabricate the first-layer structure 202. In a general sense, the first-layer structure 202 may be fabricated in any sample layer including a process layer or a resist layer. However, contrast may be improved in a process layer. As an example, if the first-layer structure 202 is printed with silicon features surrounded by an oxide, $\epsilon_{Gr}=3.8$ and $\epsilon_{sur}=1.45$. For a 1:1 duty cycle of the zones 214a,b within a coarse pitch 208, Equations (1) and (2) provide that an effective permittivity of the first zone 214a with some of the first set of periodic features 210 is $\epsilon_1=2.63$, whereas an effective permittivity of the second zone 214b with some of the second set of periodic features 212 is $\epsilon_2=2.1$. This difference in effective permittivities provides similar contrast in the image 502 as typical non-segmented targets in a resist layer and may thus be easily observable.

Referring now to FIGS. 2C and 5B, imaging of second-layer structure 204 on a second layer of the sample 110 is described in greater detail, in accordance with one or more embodiments of the present disclosure.

In embodiments, the second-layer structure 204 may include any distribution of features that maintains a polarization of an incident illumination beam 106. Put another way, the second-layer structure 204 may include any distribution of features that does not rotate the polarization of some diffraction orders in a manner similar to the first-layer structure 202. For instance, the second-layer structure 204 may incorporate features in any standard periodic or non-periodic target design that maintains a polarization of an incident illumination beam 106 (e.g., provides diffraction with an unmodified polarization direction).

FIG. 2C depicts a non-limiting configuration in which the second-layer structure 204 is a cross structure centered on the overlay target 108.

As a result, the first-layer structure 202 and the second-layer structure 204 may be independently imaged using different polarizations. An overlay measurement may then be generated using typical techniques based on the two images generated at the orthogonal polarizations. For example, an overlay measurement may be generated based on a difference between a center of symmetry of the first-layer structure 202 from a first image and a center of symmetry of the second-layer structure 204 from a second image. It is contemplated herein that mitigation of such cross-talk may increase the accuracy of an overlay measurement generated based on these two images relative to alternative techniques that suffer from cross-talk between light interacting with features on different layers of a target.

For example, the image 502 of the first-layer structure 202 in FIG. 5A generated with an illumination polarizer 112 oriented at 45 degrees and a collection polarizer 120 oriented at 135 degrees may not include the second-layer structure 204 since the light interacting with this second-layer structure 204 maintains the polarization state of the incident illumination beam 106 and is blocked by the collection polarizer 120.

In contrast, an image generated with the collection polarizer 120 oriented at 45 degrees (e.g., parallel to the illumination polarizer 112) may include only the second-layer structure 204 and not the first-layer structure 202. Rather, the light passed by the collection polarizer 120 in this orientation include light interacting with the second-layer structure 204 as well as zero-order diffraction. Although a portion of this zero-order diffraction may be associated with the first-layer structure 202 (e.g., the zero-order diffraction 402 depicted in FIG. 4), this light is insufficient to resolve any portion of the first-layer structure 202.

FIG. 5B illustrates an image 504 of the second-layer structure 204 of FIG. 2C generated with an illumination polarizer 112 and a collection polarizer 120 with parallel orientations, in accordance with one or more embodiments of the present disclosure. For example, the image 504 may be generated with the illumination polarizer 112 and the collection polarizer 120 both oriented at 45 degrees.

Figure 6B:
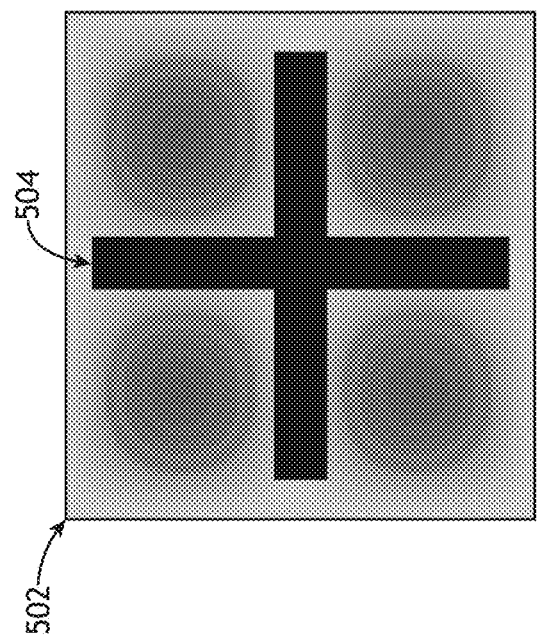
FIG. 6B illustrates the image of the first-layer structure in FIG. 5A artificially overlapped on the image of the second-layer structure in FIG. 5B, in accordance with one or more embodiments of the present disclosure.
Figure 6A:
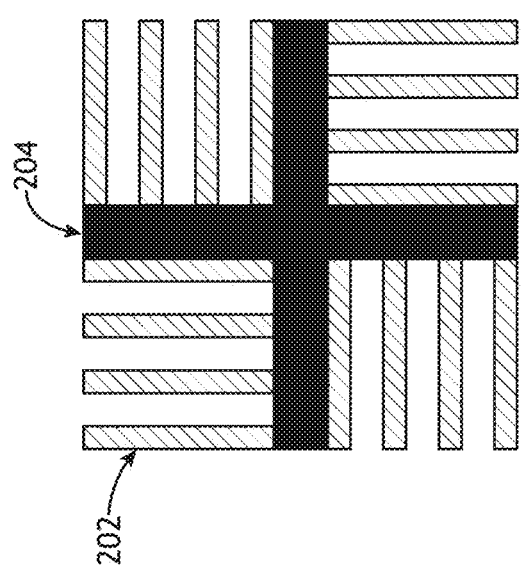
FIG. 6A illustrates a top view of the overlay target showing the relative positions of the first-layer structure and the second-layer structure, in accordance with one or more embodiments of the present disclosure.

Referring now to FIGS. 6A and 6B, it is contemplated herein that cross-talk between the first-layer structure 202 and the second-layer structure 204 may be further mitigated by reducing the physical overlap between these structures. In this way, the amount of light that interacts with both structures (e.g., double diffraction) may be limited.

The second-layer structure 204 may further be configured to provide that features in the second-layer structure 204 have relatively little overlap with features of the first-layer structure 202 (e.g., the first set of periodic features 210 and the second set of periodic features 212). For example, a design of the overlay target 108 (e.g., in accordance with a metrology recipe) may be selected to provide that an area of the overlay target 108 in which the features of the second-layer structure 204 overlap with features of the first-layer structure 202 may be below a selected threshold (e.g., 20%, 15%, 10%, 5%, 1%, or any suitable value).

FIG. 6A illustrates a top view of the overlay target 108 showing the relative positions of the first-layer structure 202 and the second-layer structure 204, in accordance with one or more embodiments of the present disclosure. As shown, this design provides that the second-layer structure 204 lies substantially within spaces between the zones 214 or edges of the zones 214 of the first-layer structure 202.

FIG. 6B illustrates the image 502 of the first-layer structure 202 in FIG. 5A artificially overlapped on the image 504 of the second-layer structure 204 in FIG. 5B, in accordance with one or more embodiments of the present disclosure. As described previously herein, the second-layer structure 204 is not actually visible on the image 502. Rather, FIG. 6B illustrates how the presence of the second-layer structure 204 in this particular design of the second-layer structure 204 may provide relatively little impact on the image 502 of the first-layer structure 202.

As shown in FIGS. 6A-6B, the particular configuration of a cross-shaped second-layer structure 204 provides relatively little overlap between the second-layer structure 204 and the first-layer structure 202, which reduces an amount of light that interacts with both structures (e.g., double diffraction) and thus effectively mitigates cross-talk. However, this design of the second-layer structure 204 is merely an illustration and the second-layer structure 204 may have any design providing suppression of cross-talk between images taken with orthogonal polarizations.

Referring generally to FIGS. 3A-6B, it is to be understood that FIGS. 3A-6B are provided solely for illustrative purposes and should not be interpreted as limiting the scope of the present disclosure. For example, FIGS. 3A-6B illustrate the particular non-limiting configuration of an overlay target 108 including a first-layer structure 202 arranged according to FIG. 2A. However, any overlay target 108 with any design of a first-layer structure 202 that provides polarization rotation of select diffraction orders is within the spirit and scope of the present disclosure. Further, the principles described with respect to FIGS. 3A-6B may be extended to any such design of an overlay target 108.

For example, it is contemplated herein that some designs of an overlay target 108 may not fully eliminate cross-talk, but may rather suppress cross-talk for at least one of the images. For instance, the polarization-rotating properties of the first-layer structure 202 may generally provide that the first images generated with cross-polarizations of the illumination beam 106 and the sample light 116 display effective suppression of signals associated with the second-layer structure 204. However, there may be some cross-talk associated with the second-layer structure 204 in the first images. In some embodiments, a design of the overlay target 108 (e.g., in accordance with a metrology recipe) may be selected to suppress signals associated with the second-layer structure 204 in the first images below a selected threshold. Similarly, the second images generated with parallel polarizers of the illumination beam 106 and the sample light 116 display effective suppression of signals associated with the first-layer structure 202. However, there may be some cross-talk associated with the first-layer structure 202 in the second images. In some embodiments, a design of the overlay target 108 (e.g., in accordance with a metrology recipe) may be selected to suppress signals associated with the first-layer structure 202 in the second images below a selected threshold. In either or both cases, suppression of cross-talk may be characterized using any suitable metric. For example, cross-talk may be characterized by a metric describing a strength of a signal associated with undesired features in an image (e.g., a strength of a signal associated with the second-layer structure 204 in a first image and/or a strength of a signal associated with the first-layer structure 202 in a second image). As another example, cross-talk may be characterized by a metric describing a contrast of desired features in an image (e.g., a contrast of first-layer structure 202 in a first image and/or a contrast of second-layer structure 204 in a second image). Regardless of the metric, it is contemplated herein that systems and methods disclosed herein may reduce cross-talk by an order of magnitude relative to existing target designs in some embodiments.

Figure 1B:
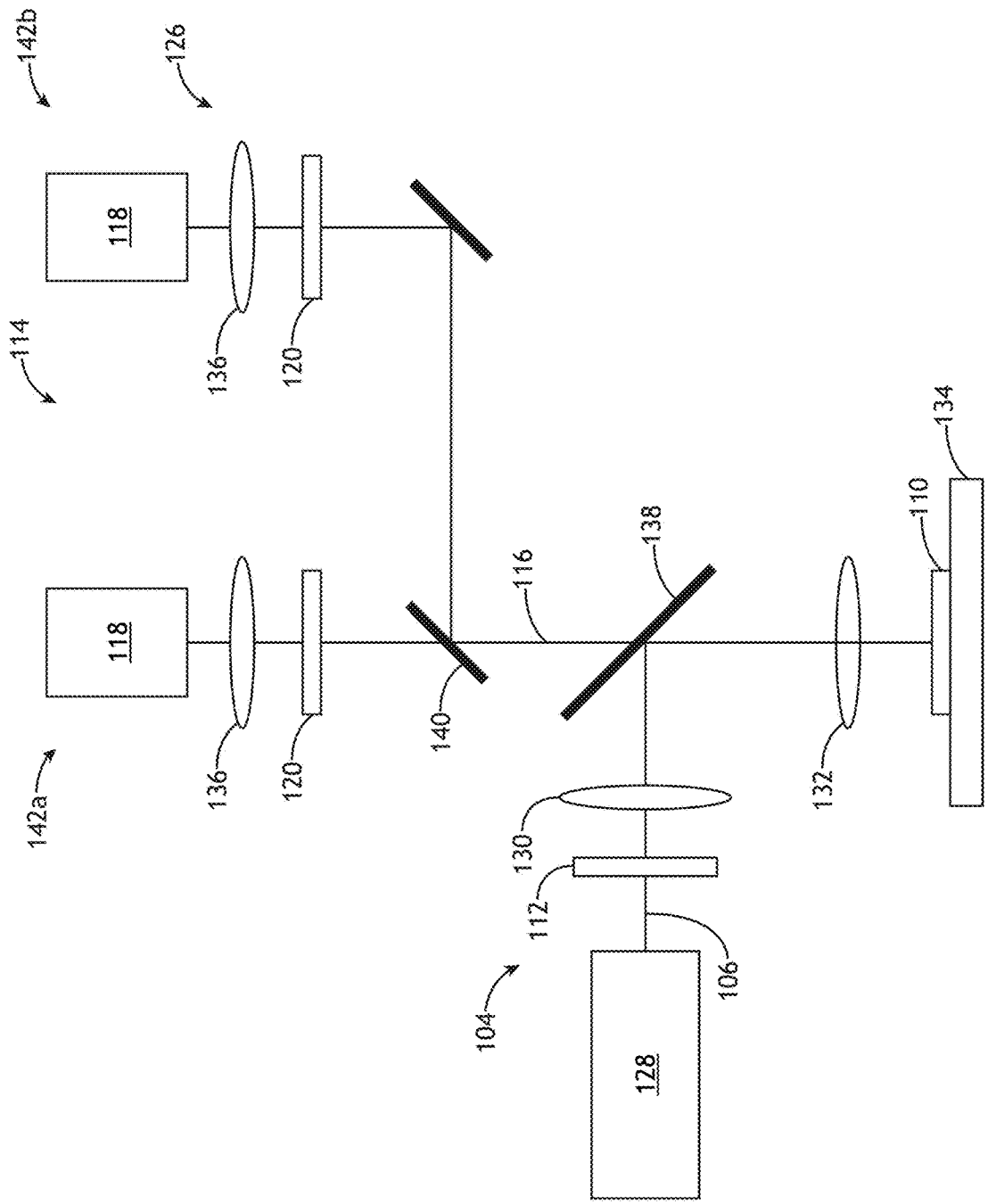
FIG. 1B is a conceptual view illustrating the optical sub-system, in accordance with one or more embodiments of the present disclosure.

Referring now to FIG. 1B, additional aspects of the overlay metrology system 100 are described in greater detail, in accordance with one or more embodiments of the present disclosure.

FIG. 1B is a conceptual view illustrating the optical sub-system 102, in accordance with one or more embodiments of the present disclosure. In some embodiments, the optical sub-system 102 includes an illumination source 128 configured to generate an illumination beam 106. The illumination beam 106 may include one or more selected wavelengths of light including, but not limited to, ultraviolet (UV) radiation, visible radiation, or infrared (IR) radiation.

The illumination source 128 may include any type of illumination source suitable for providing an illumination beam 106. In some embodiments, the illumination source 128 is a laser source. For example, the illumination source 128 may include, but is not limited to, one or more narrow-band laser sources, a broadband laser source, a supercontinuum laser source, a white light laser source, or the like. In this regard, the illumination source 128 may provide an illumination beam 106 having high coherence (e.g., high spatial coherence and/or temporal coherence). In some embodiments, the illumination source 128 includes a laser-sustained plasma (LSP) source. For example, the illumination source 128 may include, but is not limited to, a LSP lamp, a LSP bulb, or a LSP chamber suitable for containing one or more elements that, when excited by a laser source into a plasma state, may emit broadband illumination. In some embodiments, the illumination source 128 includes a lamp source. For example, the illumination source 128 may include, but is not limited to, an arc lamp, a discharge lamp, an electrode-less lamp, or the like. In this regard, the illumination source 128 may provide an illumination beam 106 having low coherence (e.g., low spatial coherence and/or temporal coherence).

In some embodiments, the illumination sub-system 104 directs the illumination beam 106 to the sample 110 or a portion thereof including at least one overlay target 108. The illumination sub-system 104 may include one or more optical components suitable for modifying and/or conditioning the illumination beam 106 as well as directing the illumination beam 106 to the sample 110. For example, the illumination sub-system 104 may include, but is not required to include, one or more lenses 130 (e.g., to collimate the illumination beam 106, to relay pupil and/or field planes, or the like), an illumination polarizer 112 to adjust the polarization of the illumination beam 106, one or more filters, one or more beam splitters, one or more diffusers, one or more homogenizers, one or more apodizers, one or more beam shapers, or one or more mirrors (e.g., static mirrors, translatable mirrors, scanning mirrors, or the like). In some embodiments, the optical sub-system 102 includes an objective lens 132 to focus the illumination beam 106 onto the sample 110 (e.g., onto the overlay target 108).

The illumination beam 106 may have any spatial profile. For example, the spatial profile may be circular. As another example, the spatial profile may be structured with a wedge profile or any other suitable shape. It is contemplated herein that structured illumination with a wedge-shaped profile with an edge either parallel to or perpendicular to a polarization direction may further suppress cross-talk in a cross-polarization imaging configuration as disclosed throughout the present disclosure.

The shape of the illumination beam 106 on the sample 110 may be controlled using any suitable optical elements within the illumination sub-system 104 such as, but not limited to, one or more stops in an illumination field plane conjugate to the sample 110.

The illumination beam 106 may have any number of poles (e.g., established in an illumination pupil plane) providing illumination at any number or range of altitude or azimuth incidence angles. In some embodiments, the illumination beam 106 may include one or more poles located in an illumination pupil at that coincide with an electric field direction (e.g., a polarization direction) of the associated light.

In some embodiments, the sample 110 is disposed on a sample stage 134 suitable for securing the sample 110 and further configured to position the sample 110 with respect to the illumination beam 106.

In some embodiments, the imaging sub-system 114 includes one or more detectors 118 configured to capture sample light 116 emanating from the sample 110 and generate one or more images of the overlay target 108, or portions thereof. The imaging sub-system 114 may include multiple optical elements to direct and/or modify illumination collected by the objective lens 132 including, but not limited to one or more lenses 136, one or more filters, one or more collection polarizers 120, one or more beam blocks, or one or more beamsplitters.

The illumination sub-system 104 and the imaging sub-system 114 of the optical sub-system 102 may be oriented in a wide range of configurations suitable for illuminating the overlay target 108 with the illumination beam 106 and collecting the sample light 116 in response to the incident illumination beam 106. For example, as illustrated in FIG. 1B, the optical sub-system 102 may include a beamsplitter 138 oriented such that the objective lens 132 may simultaneously direct the illumination beam 106 to the overlay target 108 and collect radiation emanating from the sample 110. By way of another example, the illumination sub-system 104 and the imaging sub-system 114 may contain non-overlapping optical paths.

As described throughout the present disclosure, isolated images of features of an overlay target 108 located on different layers of the sample 110 may be generated using specific orientations of an illumination polarizer 112 in the illumination sub-system 104 and a collection polarizer 120 in the imaging sub-system 114. For example, isolated images of features of an overlay target 108, including the first-layer structure 202 as illustrated in FIG. 2A, may be provided with an illumination polarizer 112 oriented at 45 degrees and a collection polarizer 120 oriented at 135 degrees. As another example, isolated images of features of an overlay target 108 including first-layer structure 202 as illustrated in FIG. 2B may be provided with an illumination polarizer 112 oriented at 0 degrees and a collection polarizer 120 oriented at 90 degrees.

In some embodiments, two isolated images are generated sequentially on a single detector 118 (e.g., in a single channel) by sequentially adjusting the orientation of a single collection polarizer 120. In some embodiments, two isolated images are generated simultaneously on two detectors 118 in different channels of the imaging sub-system 114, where the two channels include collection polarizers 120 oriented to capture the two isolated images.

As an illustration, FIG. 1B depicts a configuration in which the imaging sub-system 114 includes a beamsplitter 140 (e.g., a non-polarizing beamsplitter) to split the sample light 116 into a first channel 142a and a second channel 142b. In this way, the collection polarizers 120 in the different channels 142a,b may have orthogonal polarizations (e.g., oriented at a 90-degree with respect to each other) oriented to generate isolated images of the first-layer structure 202 and the second-layer structure 204 of an overlay target 108.

Figure 7:
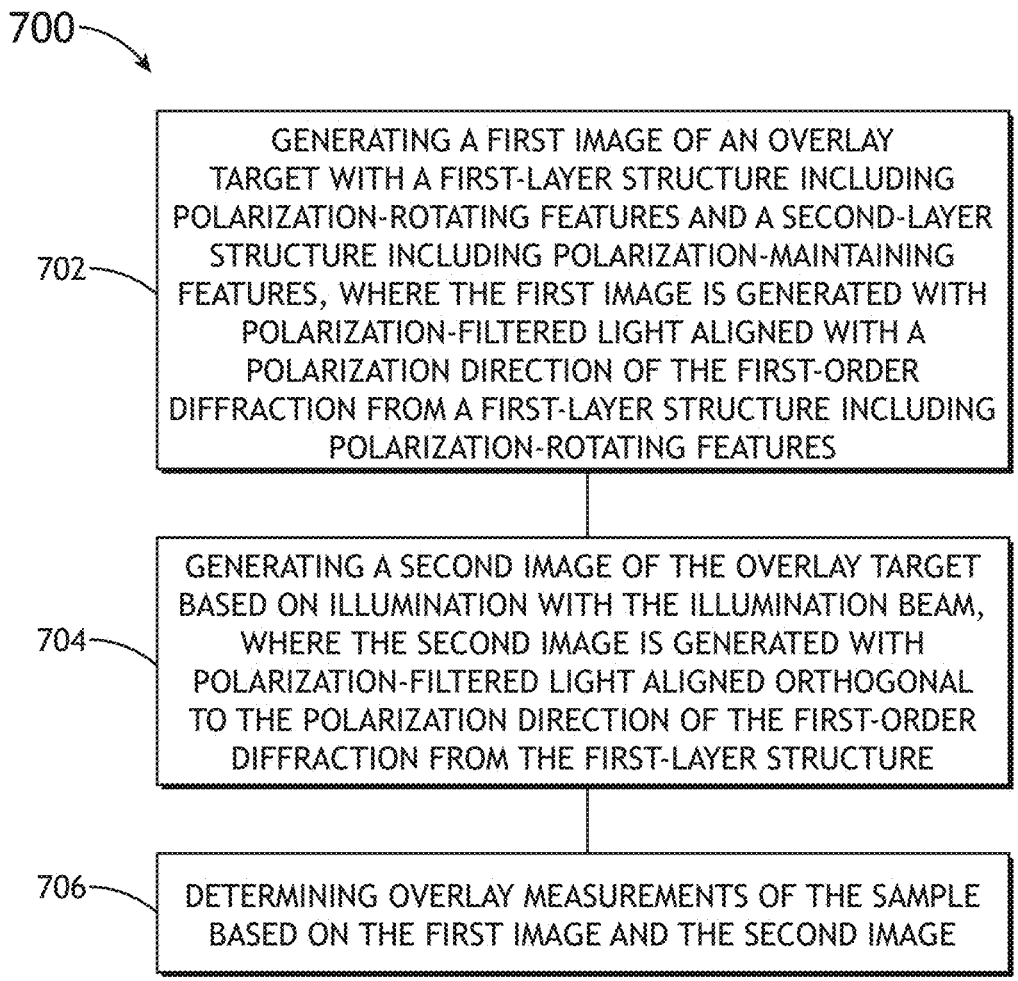
FIG. 7 is a flow diagram illustrating steps performed in a method for overlay metrology, in accordance with one or more embodiments of the present disclosure.

FIG. 7 is a flow diagram illustrating steps performed in a method 700 for overlay metrology, in accordance with one or more embodiments of the present disclosure. The embodiments and enabling technologies described previously herein in the context of the overlay metrology system 100 should be interpreted to extend to the method 700. For example, various components of the overlay metrology system 100 may implement one or more steps of the method 700 individually or in combination. In some embodiments, the processors 124 of the controller 122 may execute program instructions causing the processors 124 to implement one or more steps of the method 700 either directly or indirectly by providing control signals to one or more additional components of the overlay metrology system 100 to implement one or more steps of the method 700. It is further noted, however, that the method 700 is not limited to the architecture of the overlay metrology system 100.

In embodiments, the method 700 includes a step 702 of generating a first image of an overlay target 108 on a sample 110 with a first-layer structure 202 including polarization-rotating features and a second-layer structure 204 including polarization-maintaining features, where the first image is generated with polarization-filtered light aligned with a polarization direction of the first-order diffraction from a first-layer structure 202 (e.g., aligned with a polarization of rotated diffraction orders more generally). In this way, the one or more first images include the first-layer structure and exclude the second-layer structure.

In embodiments, the method 700 includes a step 704 of generating a second image of the overlay target 108 based on illumination with the illumination beam 106, where the second image is generated with polarization-filtered light aligned orthogonal to the polarization direction of the first-order diffraction from the first-layer structure 202 (e.g., orthogonal to a polarization of the rotated diffraction orders more generally). In this way, the one or more second images include the second-layer structure and exclude the first-layer structure.

The first and second images may be generated simultaneously or sequentially with one or more collection polarizers 120.

In embodiments, the method 700 includes a step 706 of determining overlay measurements of the sample based on the first image and the second image. Any suitable technique may be used such as, but not limited to, determining overlay based on a difference between a center of symmetry of the first-layer structure 202 in the first image and a center of symmetry of the second-layer structure 204

In some embodiments, the method 700 further includes a step of generating one or more correctables to control one or more processing tools, such as, but not limited to a lithography tool (e.g., a scanner, a stepper, or the like), an etching tool, a polishing tool, or the like. For example, correctables may be generated based on overlay measurements associated with one or more overlay targets distributed across the sample. Further, the correctables may be associated with any combination of feedback or feed-forward control. As an illustration, feedback control may correct for deviations of a process tool between different samples in a particular lot or sequence of lots. As another illustration, feed-forward control may provide adjustments for a subsequent process step based on measurements of a current process step.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An overlay metrology system comprising:
   a controller including one or more processors configured to execute program instructions causing the one or more processors to:
   receive one or more first images of an overlay target on a sample based on illumination with an illumination beam in accordance with a metrology recipe, wherein the overlay target comprises:
      a first-layer structure on a first layer of the sample, wherein the first-layer structure includes a first set of periodic features and a second set of periodic features oriented at a 90-degree angle with respect to the first set of periodic features, wherein the illumination beam is polarized at a 45-degree angle with respect to the first set of periodic features and the second set of periodic features when implementing the metrology recipe, wherein the first set of periodic features and the second set of periodic features are arranged in accordance with the metrology recipe to rotate a polarization of one or more rotated diffraction orders from the first-layer structure relative to a polarization of zero-order diffraction, wherein the one or more rotated diffraction orders include at least first-order diffraction from the first-layer structure; and
      a second-layer structure on a second layer of the sample, wherein the second-layer structure includes one or more features providing an unmodified polarization direction for light emanating from the second-layer structure in response to the illumination beam;
   wherein the one or more first images are generated with first polarization-filtered light aligned with the polarization of the one or more rotated diffraction orders;
   receive one or more second images of the overlay target based on the illumination with the illumination beam in accordance with the metrology recipe, wherein the one or more second images are generated with second polarization-filtered light aligned orthogonal to the polarization of the one or more rotated diffraction orders; and
   determine one or more overlay measurements of the sample based on the one or more first images and the one or more second images.

2. The overlay metrology system of claim 1, wherein a size of the overlay target is three micrometers or smaller in any dimension.

3. The overlay metrology system of claim 1, wherein the first layer of the sample is a process layer, wherein the second layer of the sample is a resist layer.

4. The overlay metrology system of claim 1, wherein the first layer of the sample is a resist layer, wherein the second layer of the sample is a process layer.

5. The overlay metrology system of claim 1, wherein the first set of periodic features and the second set of periodic features include features with a pitch smaller than a wavelength of the illumination beam.

6. The overlay metrology system of claim 1, wherein the illumination beam has a circular profile.

7. The overlay metrology system of claim 1, wherein the illumination beam has a wedge-shaped profile.

8. The overlay metrology system of claim 7, wherein an edge of the wedge-shaped profile is oriented parallel to a polarization direction of the illumination beam.

9. The overlay metrology system of claim 7, wherein an edge of the wedge-shaped profile is oriented orthogonal to a polarization direction of the illumination beam.

10. The overlay metrology system of claim 1, wherein the one or more first images include the first-layer structure and exclude the second-layer structure.

11. The overlay metrology system of claim 10, wherein the one or more second images include the second-layer structure and exclude the first-layer structure.

12. The overlay metrology system of claim 1, wherein the first-layer structure includes an interleaved pattern of alternating zones of the first set of periodic features and the second set of periodic features, wherein a pitch of the first set of periodic features and the second set of periodic features is a fine pitch, wherein the first-layer structure has a first coarse pitch associated with a spatial extent of a first of the zones including at least some of the first set of periodic features and an adjacent one of the zones including at least some of the second set of periodic features.

13. The overlay metrology system of claim 12, wherein the second-layer structure is non-periodic.

14. The overlay metrology system of claim 13, wherein the second-layer structure is a cross structure.

15. An overlay metrology system comprising:
   an illumination source configured to generate an illumination beam;
   an illumination sub-system including one or more lenses to direct the illumination beam to an overlay target on a sample when implementing a metrology recipe, wherein the overlay target in accordance with the metrology recipe comprises:
      a first-layer structure on a first layer of the sample, wherein the first-layer structure includes a first set of periodic features and a second set of periodic features oriented at a 90-degree angle with respect to the first set of periodic features, wherein the first set of periodic features and the second set of periodic features are arranged in accordance with the metrology recipe to rotate a polarization of one or more rotated diffraction orders from the first-layer structure relative to a polarization of zero-order diffraction, wherein the one or more rotated diffraction orders include at least first-order diffraction from the first-layer structure; and a second-layer structure on a second layer of the sample, wherein the second-layer structure includes one or more features providing an unmodified polarization direction for light emanating from the second-layer structure in response to the illumination beam;

an imaging sub-system including one or more channels, each including one or more polarizers and one or more detectors, wherein the one or more channels are configured to generate one or more first images with first polarization-filtered light aligned with the polarization of the one or more rotated diffraction orders, wherein the one or more channels are configured to generate one or more second images with second polarization-filtered light aligned orthogonal to the polarization of the one or more rotated diffraction orders; and a controller communicatively coupled to the one or more detectors, the controller including one or more processors configured to execute program instructions causing the one or more processors to determine overlay measurements of the sample based on the one or more first images and the one or more second images.

16. The overlay metrology system of claim 15, wherein a size of the overlay target is three micrometers or smaller in any dimension.

17. The overlay metrology system of claim 15, wherein the first set of periodic features and the second set of periodic features include features with a pitch smaller than a wavelength of the illumination beam.

18. The overlay metrology system of claim 15, wherein the one or more channels comprise:
a first channel to generate the one or more first images, wherein the first channel includes a first of the one or more detectors and a first polarizer aligned with the polarization of the one or more rotated diffraction orders; and
a second channel to generate the one or more second images, wherein the second channel includes a second of the one or more detectors and a second polarizer orthogonal to the polarization of the one or more rotated diffraction orders.

19. The overlay metrology system of claim 15, wherein the one or more channels includes a single channel with a single polarizer, wherein the one or more first images are generated with the single polarizer aligned with the polarization of the one or more rotated diffraction orders, wherein the one or more second images are generated with the single polarizer orthogonal to the polarization of the one or more rotated diffraction orders.

20. The overlay metrology system of claim 15, wherein the first layer of the sample is a process layer, wherein the second layer of the sample is a resist layer.

21. The overlay metrology system of claim 15, wherein the first layer of the sample is a resist layer, wherein the second layer of the sample is a process layer.

22. The overlay metrology system of claim 15, wherein the illumination beam has a circular profile.

23. The overlay metrology system of claim 15, wherein the illumination beam has a wedge-shaped profile.

24. The overlay metrology system of claim 23, wherein an edge of the wedge-shaped profile is oriented parallel to a polarization direction of the illumination beam.

25. The overlay metrology system of claim 23, wherein an edge of the wedge-shaped profile is oriented orthogonal to a polarization direction of the illumination beam.

26. The overlay metrology system of claim 15, wherein the one or more first images include the first-layer structure and exclude the second-layer structure.

27. The overlay metrology system of claim 26, wherein the one or more second images include the second-layer structure and exclude the first-layer structure.

28. The overlay metrology system of claim 15, wherein the first-layer structure includes an interleaved pattern of alternating zones of the first set of periodic features and the second set of periodic features, wherein a pitch of the first set of periodic features and the second set of periodic features is a fine pitch, wherein the first-layer structure has a first coarse pitch associated with a spatial extent of a first of the zones including at least some of the first set of periodic features and an adjacent one of the zones including at least some of the second set of periodic features.

29. The overlay metrology system of claim 28, wherein the second-layer structure is non-periodic.

30. The overlay metrology system of claim 29, wherein the second-layer structure is a cross structure.

31. An overlay metrology method comprising:
generating one or more first images of an overlay target on a sample based on illumination with an illumination beam in accordance with a metrology recipe, wherein the overlay target comprises:
a first-layer structure on a first layer of the sample, wherein the first-layer structure includes a first set of periodic features and a second set of periodic features oriented at a 90-degree angle with respect to the first set of periodic features, wherein the illumination beam is polarized at a 45-degree angle with respect to the first set of periodic features and the second set of periodic features when implementing the metrology recipe, wherein the first set of periodic features and the second set of periodic features are arranged in accordance with the metrology recipe to rotate a polarization of one or more rotated diffraction orders from the first-layer structure relative to a polarization of zero-order diffraction, wherein the one or more rotated diffraction orders include at least first-order diffraction from the first-layer structure; and
a second-layer structure on a second layer of the sample, wherein the second-layer structure includes one or more features providing an unmodified polarization direction for light emanating from the second-layer structure in response to the illumination beam;
wherein the one or more first images are generated with first polarization-filtered light aligned with the polarization of the one or more rotated diffraction orders, wherein the one or more first images include the first-layer structure and exclude the second-layer structure;
generating one or more second images of the overlay target based on the illumination with the illumination beam in accordance with the metrology recipe, wherein the one or more second images are generated with second polarization-filtered light aligned orthogonal to the polarization of the one or more rotated diffraction orders, wherein the one or more second images include the second-layer structure and exclude the first-layer structure; and
determining overlay measurements of the sample based on the one or more first images and the one or more second images.

* * * * *